June 14, 1927. G. H. CLARK Re. 16,651
ADJUSTMENT OF WAVE LENGTHS
Original Filed Jan. 18, 1915 2 Sheets-Sheet 1
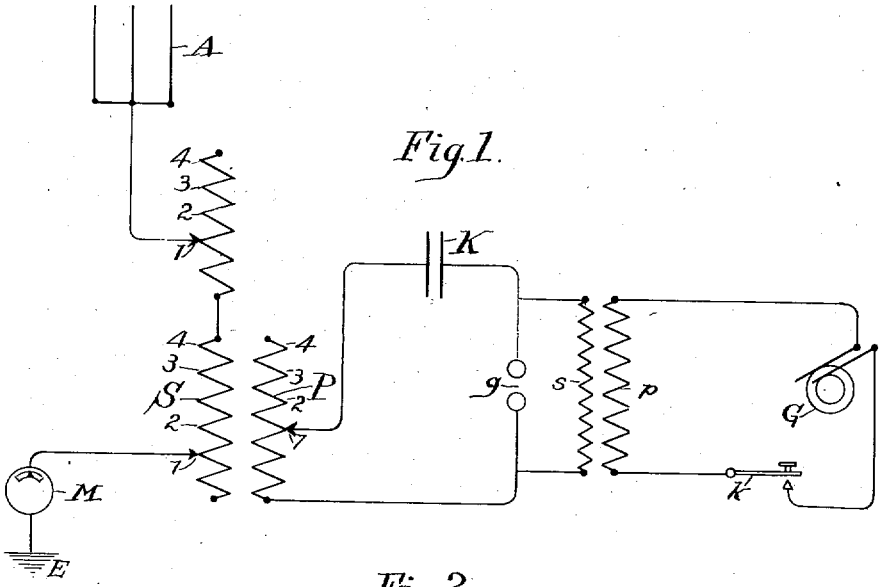
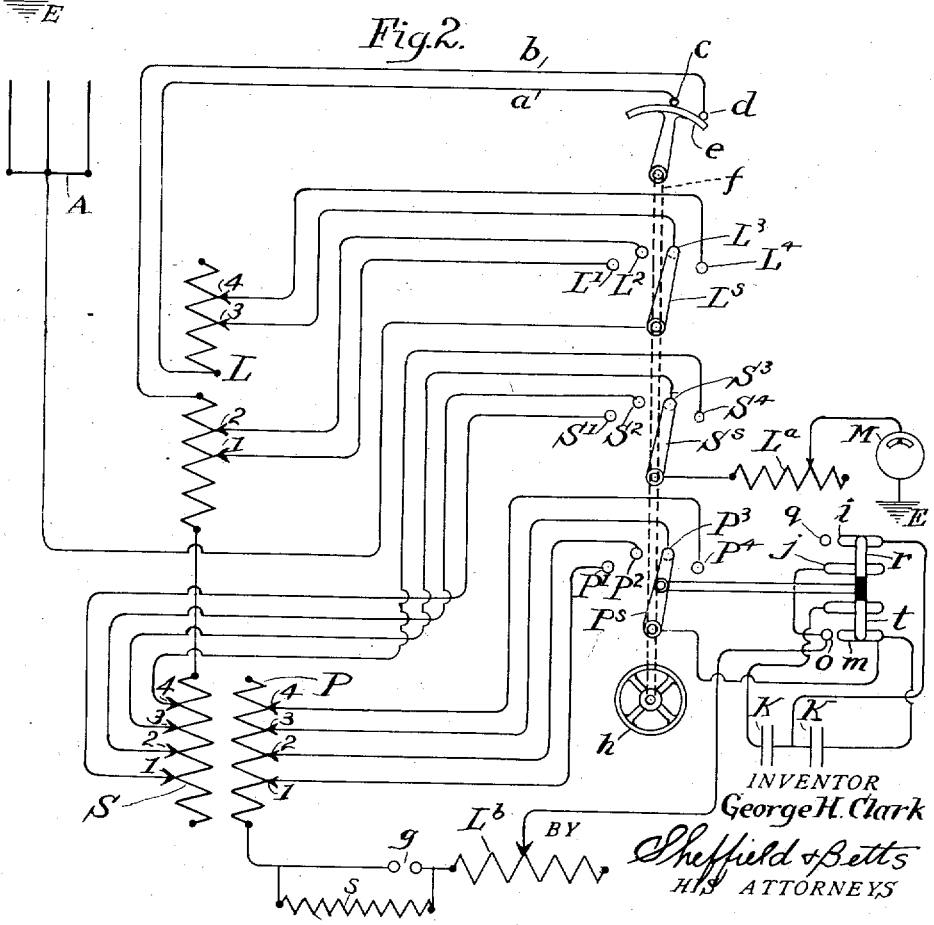

June 14, 1927. Re. 16,651

G. H. CLARK

ADJUSTMENT OF WAVE LENGTHS

Original Filed Jan. 18, 1915 2 Sheets-Sheet 2

INVENTOR
George H. Clark.
BY
Sheffield & Betts.
HIS ATTORNEYS

Reissued June 14, 1927. Re. 16,651

UNITED STATES PATENT OFFICE.

GEORGE H. CLARK, OF WASHINGTON, DISTRICT OF COLUMBIA, ASSIGNOR, BY MESNE ASSIGNMENTS, TO RADIO CORPORATION OF AMERICA, A CORPORATION OF DELAWARE.

ADJUSTMENT OF WAVE LENGTHS.

Original No. 1,323,155, dated November 25, 1919, Serial No. 2,799, filed January 18, 1915. Application for reissue filed April 20, 1920. Serial No. 375,381.

My invention relates to telegraphy, telephony, or like systems in which the energy employed is in the electro-radiant form for space systems or in the form of high frequency oscillations for conductive systems.

Heretofore in the practical and commercial use of systems such as above referred to, it has been impossible with the prior art apparatus available to change the transmission or reception quickly and promptly from a setting for one wave length or frequency to a setting for another wave length or frequency, because involving more than a single movement or adjustment of an apparatus, in fact involving a plurality of independent movements for tuning and adjusting operations with resulting loss of considerable time which is a serious disadvantage and a chief hindrance in the satisfactory operation of apparatus of this character.

It is one object of my invention to provide, either at the transmitting or receiving station, or both, apparatus whereby settings for different wave lengths or frequencies may be made by a single operation of switching mechanism which shall at the same time insure proper or desired coupling between inductively related oscillation circuits. A further object of my invention is to provide an arrangement of oscillation transformers and loading inductance of maximum convenience and efficiency.

To these ends I have devised the system and apparatus hereinafter described and constituting an embodiment of my invention.

For an illustration of one of the forms my invention may take reference is to be had to the accompanying drawings, in which:

Fig. 1 is a diagrammatic view illustrating a typical transmitting apparatus to which my invention may be applied.

Fig. 2 is a diagrammatic view illustrating electrical connections and co-operating switching mechanism for carrying out my invention in transmitting apparatus.

Fig. 1 shows a typical transmitting apparatus to which reference is made for an explanation of my invention.

Figure 3:
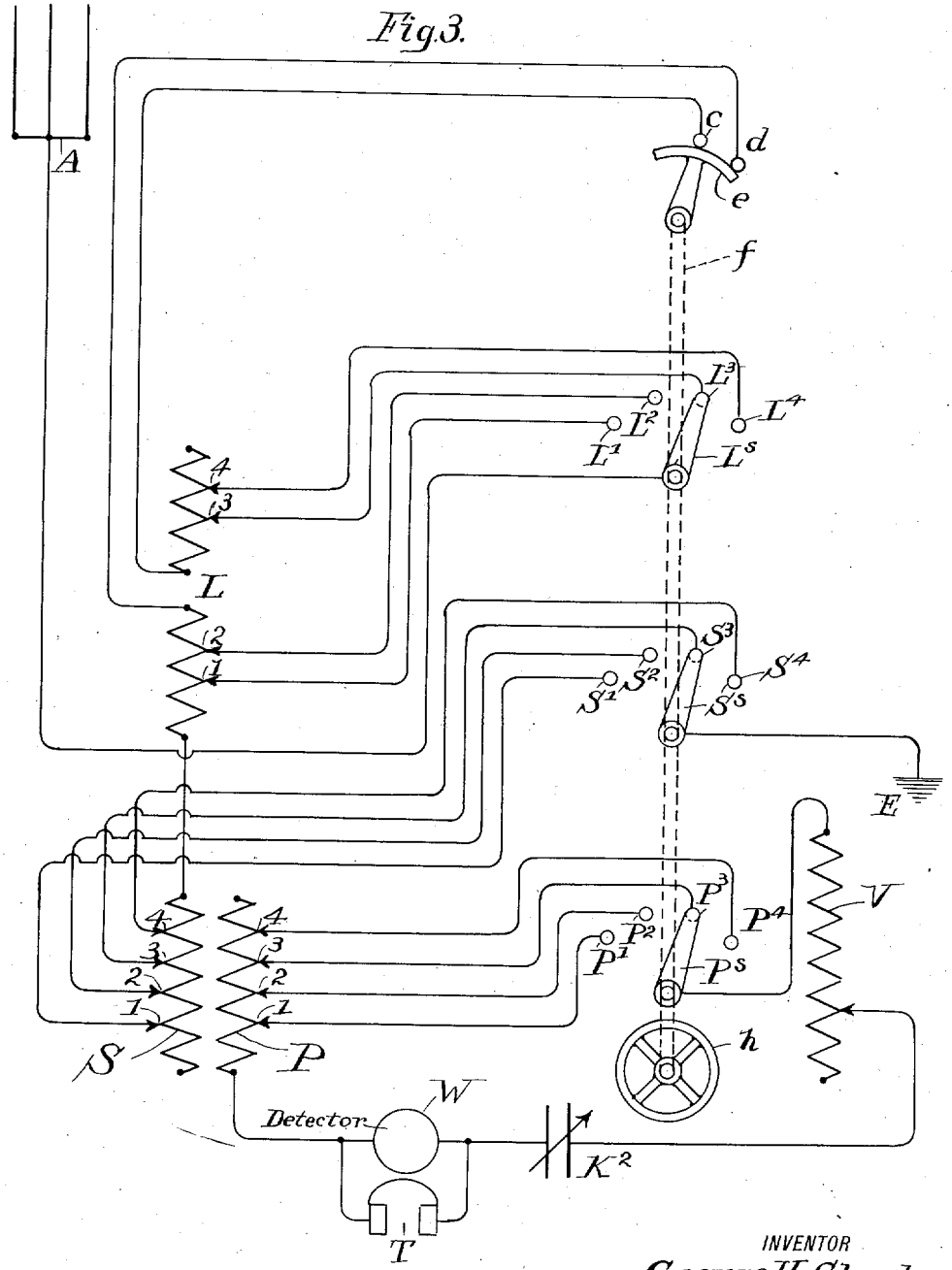
Fig. 3 is a diagrammatic view similar to Fig. 2 when used in receiving apparatus.

Referring to this figure, G is an alternating current generator or other suitable source of current connected in circuit with the primary *p* of a step-up transformer, the primary circuit being controlled by the usual transmitting key *k*. The high tension secondary *s* of the step-up transformer has its terminals connected to either side of the spark gap *g* which may be of the simple type indicated or may be of the quenched gap type, or any other suitable type. The gap *g* is in circuit with the condenser or capacity K and the variable portions of the primary P of the oscillation transformer, the circuit PK*g* being here shown as a closed oscillation circuit. The open or antenna circuit comprises a variable portion of the secondary S of the oscillation transformer, a variable portion of the loading inductance L, beyond the inductive influence of the primary P, the antenna or aerial conductor A, and the earth connection E, a radiation meter M, such as a hot wire ammeter, being included for purposes of convenience.

When it is desired to transmit energy of a certain frequency or wave length, the variable or sliding contact in the primary circuit is moved to such point on the primary P, as for example the point 1, which will insure the primary circuit producing oscillations of the desired frequency, corresponding with wave length No. 1. This setting may be determined by a wave meter, by calculation, or otherwise. The open or antenna circuit is then attuned to this same frequency or wave length, when the coupling between P and S is loose, by adjusting the variable contacts on S or on L until the meter M gives a maximum reading. Then by making the coupling between P and S closer and of such character as is to be employed in transmitting energy having wave length No. 1 the rider or contact sliding on the loading inductance L will have to be moved to some new position until the wave meter indicates but a single maximum in the resonance curve, and the adjustment is further varied until with this single maximum in the resonance curve the meter M indicates a maximum reading for that particular coupling. And in this connection the point 1 in the primary P may have to be varied slightly from its first setting. However, by these well-known methods the setting of the inductance L, of secondary S and of primary P are determined for the wave length No. 1. Similarly for another wave length, say No. 2, the settings will be at the points indicated by 2; the settings for a third wave length by 3, and for the fourth wave length by 4.

In all cases the necessary or desired inductance in the antenna or open circuit for any given wave length can be so proportioned between the secondary S and the loading inductance L that the same mechanical coupling, that is, same physical or mechanical distance or relation between the primary P and secondary S can be obtained for all wave lengths. In making this adjustment of the relative amounts of inductance in S and L for any wave length, if the coupling is too close, the number of turns in S is reduced and the number of turns in L is increased, and conversely if the coupling is too loose, the number of turns in L is reduced and the number of turns in S is increased.

By my invention I provide switching mechanism, a single movement of which will transfer the movable contacts on P, S and L to the proper points for transmission of these various wave lengths while maintaining the desired or proper coupling between the primary P and the secondary S, this coupling being generally such as will cause a transmission of maximum energy from the closed oscillation circuit to the open antenna circuit.

In Fig. 2 this same general arrangement is shown except that the primary *p* of the step-up transformer and its circuit are omitted, and there is added the switching mechanism referred to and additional variable inductances or variometers in the open and closed circuits for sake of convenience.

The points 1, 2, 3 and 4 for the four different wave lengths are indicated as in Fig. 1. From the four points 1, 2, 3 and 4 of the primary P connections are made to the four contacts $P^1$, $P^2$, $P^3$ and $P^4$ adapted to be engaged by the switch arm $P^s$. Similarly the four points 1, 2, 3 and 4 on the secondary S are connected respectively with the four switch contacts $S^1$, $S^2$, $S^3$ and $S^4$, with which the movable switch arm $S^s$ is adapted to engage. And similarly the four points 1, 2, 3 and 4 on the inductance L are connected with the four switch contacts $L^1$, $L^2$, $L^3$ and $L^4$ with which the switch arm $L^s$ is adapted to engage. Inductance L is here shown as divided into two parts, though a greater number may be employed if desired, in order that when one part of the inductance is not in use it may be cut out of circuit (or short circuited as hereinafter described) to prevent energy consumption by such idle portion. For this purpose connections are made from the adjacent ends of the two inductance portions by conductors *a* and *b* with the switch contacts *c* and *d* which are adapted to be bridged, when both parts of the inductance are to be used, by the switch contact *e*. The antenna A is connected with the switch arm $L^s$. And the switch arms $S^s$ connects to the earth E through the radiation meter M and, if desired, an additional variable inductance $L^a$, which may be set at once for all wave lengths of a group, may be employed.

And in the primary circuit an additional inductance $L^b$ may be employed if required or desired.

The switch arms $P^s$, $S^s$, $L^s$ and *e* are mechanically connected together, as by member or shaft *f*, which may be provided with a hand wheel or other operating device *h*.

In this figure are shown two condensers or banks of condensers K, K which may be connected in parallel or in series with each other under various circumstances. Switching mechanism for changing these condenser connections comprises stationary switch contacts *i*, *j*, *m*, *n*, *o*, and the blank *q*. The two movable contacts *r* and *t* are mechanically connected together but insulated from each other and mechanically connected with the operating mechanism for the switches previously described, this connection causing the contacts *r* and *t* to be in position shown, and thereby connect the condensers K, K in parallel with each other, for the three right hand positions of the switch $P^s$, but when the switch $P^s$ engages with the contact $P^1$, the contacts *t*, *r* are shifted toward the left, *r* remaining in contact with *j* and engaging the blank *q*, while *t* remains in contact with *n* and connects the same to *o*, in which case the condensers K, K are in series with each other in the primary circuit, the switch $P^s$ being connected with the contact *m*. The object of this is to have less capacity in circuit for the shorter wave length or lengths so that the corresponding co-operating inductance of the primary circuit will be a substantial part of the primary P. And in reverse movement of the switch arm $P^s$, the switch contacts *t* and *r* are restored to the position shown and occupy such position for all positions of the switch arm $P^s$ when engaging contacts $P^2$, $P^3$ and $P^4$.

With the parts in the position illustrated in Fig. 2 the connections are such as to transmit wave length No. 3, the amount of inductance L, the coupling between P and S, the number of turns or length of P in the primary circuit being proper for this wave length. When shifting to any of the other positions the other and corresponding wave lengths will be transmitted while maintaining the coupling at the proper and desired amount and the amount of inductance in the closed and open circuits at the proper amount.

When the switch arm $L^s$ moves to the left on to contact $L^2$ or contact $L^1$ the upper part of the inductance L will not be in use, and it is therefore open circuited for both these positions by the withdrawal of the switch contact *e* from bridging relation with contacts *c* and *d*.

While the apparatus thus far described has been transmitting apparatus it will be understood that the same functions may be procured for receiving apparatus.

Thus in Fig. 3, Fig. 2 has been reproduced, but in place of the apparatus shown in the primary circuit of Fig. 2, receiving apparatus is shown. And what was the primary P of Fig. 2 is now in reality the secondary of an oscillation transformer which is included in circuit with the variable capacity $K^2$ a variable inductance or variometer V and a wave responsive device or detector W in shunt with which is connected a telephone receiver T or other suitable instrumentality.

Here again it will be understood that for receiving on different wave lengths the operator need merely turn the hand wheel *h* to any of the positions, and then by varying V and $K^2$ maximum response will be obtained by tuning.

In both transmitting and receiving apparatus above described, the total inductance of the primary circuit and the total inductance of the secondary circuit are simultaneously changed for the different wave lengths by a single movement of the switching apparatus, and for each of these different values of total inductance of primary circuit and of total inductance of secondary circuit, the optimum coupling is maintained without relative movement between the primary and secondary coils.

As well understood in this art, the co-efficient of coupling between primary and secondary circuits is equal to the mutual induction divided by the square root of the product of the total inductance of the primary circuit multiplied by the total inductance of the secondary circuit. By my invention the co-efficient of coupling, or as generally termed, "the coupling", is maintained at the optimum value for the different wave lengths with a given separation between the primary and secondary coils for all those wave lengths. The switching apparatus changes the total inductances of primary and secondary circuits, the connections from the switch points to the primary, secondary and inductance being to such points in them that the mechanical coupling is maintained the same for the different wave lengths.

While with my apparatus hereinbefore described the change from one wave length or frequency to another is accomplished by a single movement, as by a single actuation of the hand wheel *h* for a given position of the secondary S with respect to the primary P, or a given separation between them, my invention comprehends also the accomplishment of the same result for different relative positions of or separations between the secondary S and the primary P, both when such separation is changed by manually shifting one or the other and when such separation is changed or varied by mechanical means.

The shaft *f* need not be rotated or actuated manually but may be actuated by a suitable motive device electrically or otherwise controlled from a distance to cause the shaft *f* to partake of the proper degrees of rotation for shifting the mechanism to the proper positions for the various wave lengths or frequencies.

What I claim is:

1. The combination with the primary and secondary of an oscillation transformer, of a variable inductance in circuit with one of them, a separate switch having connections with each of said primary, secondary and said inductance for varying them to simultaneously procure predetermined couplings between said primary and secondary and the requisite amount of inductance for each of a plurality of oscillation frequencies, and means common to all of said switches for actuating them in unison.

2. The combination with the primary and secondary windings of an oscillation transformer, of an additional loading inductance in series with one of said windings, a switch for varying the magnitude of said inductance, a switch for varying a winding of said transformer, and means causing said switches to move in unison with each other, the variations caused by said switches being complementary to each other for maintaining a predetermined coupling for a plurality of different wave lengths.

3. The combination with a winding of an oscillation transformer, and a variable loading inductance in series therewith, of a unicontrol switch system connected with said winding and said loading inductance and serving to simultaneously complementarily vary the amount of each in circuit for maintaining a predetermined coupling for each of a plurality of wave lengths.

4. The combination with the primary and secondary of an oscillation transformer occupying a predetermined position with respect to each other, of a variable inductance in circuit with one of them, and a separate switch having connections with each of said primary, secondary and said variable inductance for varying them simultantously to maintain a predetermined coupling between the primary and secondary circuits while adjusting said circuits to different wave lengths, and means common to all of said switches for actuating them in unison.

5. The combination with the primary and secondary of an oscillation transformer occupying a predetermined position with respect to each other, of a variable inductance in circuit with one of said transfomer windings, and a plurality of switches having connections with said variable inductance and with the winding in circuit therewith for varying them simultaneously to maintain a predetermined coupling between primary and secondary circuits while adjusting the circuit of said inductance to different wave lengths, and means common to said plurality of switches for actuating them in unison.

6. The combination with the primary and secondary of an oscillation transformer, of an inductance in circuit with one of them, a switch and connections therefrom to said primary for varying the amount of said primary in circuit, a second switch and connections therefrom to said secondary for varying the amount of said secondary in circuit, a third switch and connections therefrom to said inductance for varying the amount of said inductance in circuit, means mechanically coupling together said switches, said connections being so adjusted that the circuits may be set to various wave lengths by movement of said means without changing the predetermined coupling between the circuits.

7. The combination with a transformer, of adjusting means therefor, tuning means in both primary and secondary circuits of said transformer, means common to said tuning means and to said adjusting means for operating them simultaneously to change the wave length of the circuits while maintaining them in tune with each other and maintaining optimum coupling.

8. The combination with a transformer, of adjusting means therefor, primary and secondary circuits therefor, a variable tuning inductance in series with one of said circuits, a single control means common to said adjusting means and to said inductance for adjusting the transformer and for varying the magnitude of the series tuning inductance simultaneously to vary the period of said one of said circuits while maintaining optimum coupling between the two circuits.

9. The combination with a winding of an oscillation transformer, of an inductance in circuit therewith, said inductance having a plurality of sections, a switch connected with said winding and said inductance and serving to simultaneously complementarily alter the amount of each in circuit for maintaining an optimum coupling for each of a plurality of wave lengths, and a variable connection to each section of inductance for varying the amount of such section to compensate for circuit variations.

10. The combination with an antenna, of a plurality of inductance sections, a variable connection to each section for varying the amount of such section to compensate for antenna variations, primary and secondary coils of an oscillation transformer, means for determining the number of sections of said inductance and the portion of one coil of said transformer in circuit, means for determining the portion of the other coil of said transformer in circuit, and means common to all of said means for actuating them in unison.

11. The combination with an antenna, of an oscillation transformer and an inductance, said inductance having a plurality of separated sections, switching mechanism for simultaneously maintaining a predetermined coupling and adjusting for different wave lengths, said switching mechanism having connections to variable connections on said inductance sections, said variable connections serving to compensate for antenna variations.

12. The combination with an antenna, of an oscillation transformer and an inductance, said inductance having a plurality of separated sections, switching mechanism for simultaneously maintaining a predetermined coupling and adjusting for different wave lengths, said switching mechanism having connections to variable connections on said inductance sections, said variable connections serving to compensate for antenna variations, the sections of said inductance lying in parallel planes and so closely adjacent that they are within effective inductive influence of each other.

13. In combination two operatively associated oscillatory circuits, a variable tuning element in each circuit, means other than said tuning elements for coupling said circuits, means to adjust the coupling, and common operating means for simultaneously varying said tuning elements to tune the circuits and adjusting said coupling means to optimum coupling for the selected wave length.

GEORGE H. CLARK.